(12) United States Patent
Mayer et al.

(10) Patent No.: US 8,779,383 B2
(45) Date of Patent: Jul. 15, 2014

(54) ENRICHED SILICON PRECURSOR COMPOSITIONS AND APPARATUS AND PROCESSES FOR UTILIZING SAME

(71) Applicant: Advanced Technology Materials, Inc., Danbury, CT (US)

(72) Inventors: James J. Mayer, Fischer, TX (US); Richard S. Ray, New Milford, CT (US); Robert Kaim, Brookline, MA (US); Joseph D. Sweeney, Winsted, CT (US)

(73) Assignee: Advanced Technology Materials, Inc., Danbury, CT (US)

( * ) Notice: Subject to any disclaimer, the term of this patent is extended or adjusted under 35 U.S.C. 154(b) by 0 days.

(21) Appl. No.: 13/898,809

(22) Filed: May 21, 2013

(65) Prior Publication Data

US 2013/0264492 A1 Oct. 10, 2013

Related U.S. Application Data

(63) Continuation-in-part of application No. 13/840,961, filed on Mar. 15, 2013, which is a continuation of application No. 13/567,571, filed on Aug. 6, 2012, now Pat. No. 8,399,865, which is a continuation of application No. 13/401,527, filed on Feb. 21, 2012, now Pat. No. 8,237,134, which is a continuation of application No. PCT/US2011/026388, filed on Feb. 26, 2011.

(60) Provisional application No. 61/308,428, filed on Feb. 26, 2010, provisional application No. 61/390,715, filed on Oct. 7, 2010.

(51) Int. Cl.
*H01J 27/02* (2006.01)
*H01L 21/265* (2006.01)
*G21K 5/00* (2006.01)

(52) U.S. Cl.
USPC ............... 250/428; 250/492.21; 250/492.2; 250/492.3; 250/423 R; 250/424

(58) Field of Classification Search
USPC .......... 250/428, 492.21, 492.1, 492.2, 492.3, 250/423 R, 424
See application file for complete search history.

(56) References Cited

U.S. PATENT DOCUMENTS

| 4,331,647 A | 5/1982 | Goldenberg |
| 4,348,376 A | 9/1982 | Goldenberg |

(Continued)

FOREIGN PATENT DOCUMENTS

| EP | 0079705 A1 | 5/1983 |
| EP | 0656668 B1 | 3/1999 |

(Continued)

OTHER PUBLICATIONS

Becher, H., et al., "Vibrational Spectra of Normal, Boron-10-Enriched, and Deuteriomethylboron Difluoride", "Spectrochimica Acta Part A: Molecular Spectroscopy", 1978, pp. 141-146 (English Abstract), vol. 34, No. 2.

(Continued)

*Primary Examiner* — Michael Logie
(74) *Attorney, Agent, or Firm* — Hultquist, PLLC; Steven J. Hultquist; Rosa Yaghmour

(57) ABSTRACT

Isotopically enriched silicon precursor compositions are disclosed, as useful in ion implantation to enhance performance of the ion implantation system, in relation to corresponding ion implantation lacking such isotopic enrichment of the silicon precursor composition. The silicon dopant composition includes at least one silicon compound that is isotopically enriched above natural abundance in at least one of $^{28}$Si, $^{29}$Si, and $^{30}$Si, and may include a supplemental gas including at least one of a co-species gas and a diluent gas. Dopant gas supply apparatus for providing such silicon dopant compositions to an ion implanter are described, as well as ion implantation systems including such dopant gas supply apparatus.

17 Claims, 2 Drawing Sheets

(56) References Cited

U.S. PATENT DOCUMENTS

| | | |
|---|---|---|
| 4,657,774 A | 4/1987 | Satou et al. |
| 4,680,358 A | 7/1987 | Yu |
| 4,722,978 A | 2/1988 | Yu |
| 4,803,292 A | 2/1989 | Ohfune et al. |
| 4,847,504 A | 7/1989 | Aitken |
| 4,851,255 A | 7/1989 | Lagendijk et al. |
| 4,942,246 A | 7/1990 | Tanaka et al. |
| 5,061,322 A | 10/1991 | Asano |
| 5,899,733 A | 5/1999 | Gisdakis et al. |
| 5,943,594 A | 8/1999 | Bailey et al. |
| 5,977,552 A | 11/1999 | Foad |
| 5,993,766 A | 11/1999 | Tom et al. |
| 6,086,837 A | 7/2000 | Cowan et al. |
| 6,096,467 A | 8/2000 | Shimizu et al. |
| 6,135,128 A | 10/2000 | Graf et al. |
| 6,146,601 A * | 11/2000 | Abesadze et al. ............ 423/89 |
| 6,215,125 B1 | 4/2001 | Chen et al. |
| 6,376,664 B1 | 4/2002 | Chan et al. |
| 6,420,304 B1 | 7/2002 | Tsai et al. |
| 6,486,227 B2 | 11/2002 | Nohr et al. |
| 6,559,462 B1 | 5/2003 | Carpenter et al. |
| 6,600,092 B2 | 7/2003 | Lee |
| 6,730,568 B2 | 5/2004 | Sohn |
| 6,780,896 B2 | 8/2004 | MacDonald et al. |
| 6,852,610 B2 | 2/2005 | Noda |
| 6,872,639 B2 | 3/2005 | DeBoer et al. |
| 6,893,907 B2 | 5/2005 | Maydan et al. |
| 6,905,947 B2 | 6/2005 | Goldberg |
| 7,094,670 B2 | 8/2006 | Collins et al. |
| 7,138,768 B2 | 11/2006 | Maciejowski et al. |
| 7,144,809 B2 | 12/2006 | Elers et al. |
| 7,397,048 B2 | 7/2008 | Singh et al. |
| 7,473,606 B2 | 1/2009 | Hsiao et al. |
| 7,641,879 B2 | 1/2010 | Spielvogel et al. |
| 7,655,931 B2 | 2/2010 | Gupta |
| 7,666,770 B2 | 2/2010 | Sasaki et al. |
| 7,759,657 B2 | 7/2010 | Tieger et al. |
| 7,825,016 B2 | 11/2010 | Giles |
| 7,833,886 B2 | 11/2010 | Giles et al. |
| 7,919,402 B2 | 4/2011 | Jacobson et al. |
| 7,947,582 B2 | 5/2011 | Hautala et al. |
| 7,966,879 B2 | 6/2011 | Dietz et al. |
| 8,013,312 B2 | 9/2011 | Adams |
| 8,062,965 B2 | 11/2011 | Kaim et al. |
| 8,187,971 B2 | 5/2012 | Russell et al. |
| 8,237,134 B2 * | 8/2012 | Kaim et al. ............ 250/492.21 |
| 8,237,136 B2 | 8/2012 | Hautala et al. |
| 8,252,651 B2 | 8/2012 | Kawasaki |
| 8,399,865 B2 * | 3/2013 | Kaim et al. ............ 250/492.21 |
| 8,555,705 B2 * | 10/2013 | Dietz et al. ............ 73/53.01 |
| 8,598,022 B2 * | 12/2013 | Kaim et al. ............ 438/515 |
| 2002/0014407 A1 | 2/2002 | Allen et al. |
| 2003/0023118 A1 | 1/2003 | Kanayama et al. |
| 2003/0203608 A1 | 10/2003 | DeBoer et al. |
| 2003/0216014 A1 | 11/2003 | Goldberg |
| 2004/0002202 A1 | 1/2004 | Horsky et al. |
| 2004/0110351 A1 | 6/2004 | Narasimha |
| 2004/0166612 A1 | 8/2004 | Maydan et al. |
| 2004/0235280 A1 | 11/2004 | Keys et al. |
| 2004/0241460 A1 | 12/2004 | Bedell et al. |
| 2005/0163693 A1 | 7/2005 | Spielvogel et al. |
| 2005/0191816 A1 | 9/2005 | Vanderpool et al. |
| 2005/0202657 A1 | 9/2005 | Borland et al. |
| 2005/0277246 A1 | 12/2005 | Kirkpatrick et al. |
| 2005/0287786 A1 * | 12/2005 | Gammel et al. ............ 438/618 |
| 2006/0097193 A1 | 5/2006 | Horsky et al. |
| 2006/0102464 A1 | 5/2006 | Tillotson |
| 2006/0104851 A1 | 5/2006 | Tillotson |
| 2006/0264051 A1 | 11/2006 | Thibaut |
| 2007/0059848 A1 | 3/2007 | Sasaki et al. |
| 2007/0148888 A1 | 6/2007 | Krull et al. |
| 2007/0178679 A1 | 8/2007 | Hatem et al. |
| 2008/0149929 A1 | 6/2008 | Giles |
| 2008/0179545 A1 | 7/2008 | Perel et al. |
| 2008/0237496 A1 | 10/2008 | Gupta |
| 2008/0242066 A1 | 10/2008 | Jacobson et al. |
| 2008/0248636 A1 | 10/2008 | Olander et al. |
| 2008/0305598 A1 | 12/2008 | Horsky et al. |
| 2009/0200643 A1 * | 8/2009 | Miki et al. ............ 257/607 |
| 2009/0252887 A1 | 10/2009 | Barker et al. |
| 2009/0294698 A1 | 12/2009 | Ray |
| 2010/0112795 A1 | 5/2010 | Kaim et al. |
| 2010/0176306 A1 | 7/2010 | Lin et al. |
| 2011/0065268 A1 | 3/2011 | Olander et al. |
| 2011/0079241 A1 | 4/2011 | Sinha et al. |
| 2011/0097882 A1 | 4/2011 | Kaim et al. |
| 2012/0108044 A1 | 5/2012 | Kaim et al. |
| 2012/0119113 A1 | 5/2012 | Colvin et al. |
| 2012/0252195 A1 | 10/2012 | Jones et al. |
| 2013/0206788 A1 | 8/2013 | Kaim et al. |

FOREIGN PATENT DOCUMENTS

| | | |
|---|---|---|
| JP | 58-8071 A | 1/1983 |
| JP | 63-15228 A | 1/1988 |
| JP | 64-83147 A | 3/1989 |
| JP | 1-225117 A | 9/1989 |
| JP | 5-254808 A | 10/1993 |
| JP | 6-80681 A | 3/1994 |
| JP | 7-90201 A | 4/1995 |
| JP | 10-251592 A | 9/1998 |
| JP | 2001-332509 A | 11/2001 |
| KR | 10-2006-0077942 A | 7/2006 |
| TW | 200616104 A | 5/2006 |
| WO | 9811764 A1 | 3/1998 |
| WO | 03057667 A2 | 7/2003 |
| WO | 03100806 A1 | 12/2003 |
| WO | 2004003973 A2 | 1/2004 |
| WO | 2004053945 A2 | 6/2004 |
| WO | 2005020306 A1 | 3/2005 |
| WO | 2005027208 A1 | 3/2005 |
| WO | 2005059942 A2 | 6/2005 |
| WO | 2006095086 A2 | 9/2006 |

OTHER PUBLICATIONS

Byl, O., et al., "Properties of Diboron Tetrafluoride (B2F4), A New Gas for Boron Ion Implantation", "AIP Conference Proceedings", Jan. 1, 2011, pp. 408-410, vol. 1321.

Freer, B., et al., "Germanium Operation on the GSDIII/LED and Ultra High Current Ion Implanters", "Proceedings of the 14th International Conference on Ion Implantation Technology", Sep. 27, 2002, pp. 420-423.

Greenwell, D., et al., "Ion Implant Related Trends in Devices and Process Engineering", "Proceedings of the 11th International Conference on Ion Implantation Technology, Austin, TX", Jun. 16-21, 1996, pp. 1-4.

Hess, D., et al, "Performance Comparison of Enriched versus Non-Enriched SDS GeF4", "Conference on Ion Implantation Technology", Sep. 17-22, 2000, pp. 726-729.

Rendon, M., et al., "Reducing Arsenic to Germanium Cross-Contamination with Isotopically Enriched SDS 72GeF4", "Conference on Ion Implantation Technology", Sep. 17-22, 2000, pp. 707-710.

Sinn, C., et al., "Application of Isotopically Enriched Germanium Tetrafluoride for Contaminant Reduction and Ion Source Lifetime Benefits", "Proceedings of the 14th International Conference on Ion Implantation Technology", Sep. 27, 2002, pp. 411-412.

Weast, R. (Ed.), "Physical Constants of Inorganic Compounds—Boric Acid", "Handbook of Chemistry and Physics, 56th Edition", Sep. 1975, pp. B-78, Publisher: CRC Press, Inc.

Thomson Reuters, "XP-002713450—Ion implantation capable of preventing characteristic deterioration due to contamination in ion implantation process", "Database World Patent Index Week 200727", Jul. 5, 2006, p. 1.

Yu, J., et al., "Isotopically Enriched 10BN Nanotubes", "Advanced Materials", Jul. 2006, pp. 2157-2160, vol. 18.

* cited by examiner

ENRICHED SILICON PRECURSOR COMPOSITIONS AND APPARATUS AND PROCESSES FOR UTILIZING SAME

CROSS-REFERENCE TO RELATED APPLICATIONS

The present application is a continuation-in-part under 35 USC 120 of U.S. patent application Ser. No. 13/840,961 filed Mar. 15, 2013 in the names of Robert Kaim, et al. for "METHOD AND APPARATUS FOR ENHANCED LIFETIME AND PERFORMANCE OF ION SOURCE IN AN ION IMPLANTATION SYSTEM," which in turn is a continuation under 35 USC 120 of U.S. patent application Ser. No. 13/567,571, filed Aug. 6, 2012, in the names of Robert Kaim, et al. for "METHOD AND APPARATUS FOR ENHANCED LIFETIME AND PERFORMANCE OF ION SOURCE IN AN ION IMPLANTATION SYSTEM," issuing Mar. 19, 2013 as U.S. Pat. No. 8,399,865, which is a continuation under 35 USC 120 of U.S. patent application Ser. No. 13/401,527, filed Feb. 21, 2012, in the names of Robert Kaim, et al. for "METHOD AND APPARATUS FOR ENHANCED LIFETIME AND PERFORMANCE OF ION SOURCE IN AN ION IMPLANTATION SYSTEM," issued Aug. 7, 2012 as U.S. Pat. No. 8,237,134, which is a continuation under 35 USC 120 of International Application PCT/US2011/026388, with an international filing date of Feb. 26, 2011 in the names of Robert Kaim, et al. for "METHOD AND APPARATUS FOR ENHANCED LIFETIME AND PERFORMANCE OF ION SOURCE IN AN ION IMPLANTATION SYSTEM," which International Application claims the benefit of priority under 35 USC 119 of U.S. Provisional Patent Application No. 61/308,428 filed Feb. 26, 2010 in the names of Robert Kaim, et al. for "METHOD AND APPARATUS FOR ENHANCED LIFETIME AND PERFORMANCE OF ION SOURCE IN AN ION IMPLANTATION SYSTEM" and the benefit of priority under 35 USC 119 of U.S. Provisional Patent Application No. 61/390,715 filed Oct. 7, 2010 in the names of Robert Kaim, et al. for "METHOD AND APPARATUS FOR ENHANCED LIFETIME AND PERFORMANCE OF ION SOURCE IN AN ION IMPLANTATION SYSTEM." The disclosures of said U.S patent applications, said International Application and said U.S. Provisional Patent Application Nos. 61/308,428 and 61/390,715 are hereby incorporated herein by reference, in their respective entireties, for all purposes.

FIELD

The present disclosure relates to silicon dopant compositions for ion implantation, and the use of such dopant compositions to achieve enhanced performance of an ion implantation system, e.g., increased lifetime of an ion source in an ion implantation system, achievement of higher beam currents, etc.

DESCRIPTION OF THE RELATED ART

Ion implantation as practiced in applications such as manufacture of semiconductor and optoelectronic products manufacturing involves incorporation of an implantation species in a substrate, e.g., a wafer, by impinging energetic ions of the implantation species on the substrate. In order to generate the ionic implantation species, a dopant composition comprising the dopant species is subjected to ionization. This ionization is carried out using an ion source to generate an ion beam.

Once generated at the ion source, the ion beam is processed by extraction, magnetic filtering, acceleration/deceleration, analyzer magnet processing, collimation, scanning and magnetic correction to produce the final ion beam that is impinged on the substrate.

Various types of ion sources have been developed, including inductively heated cathode ion sources, Freeman, Bernas, and various others, but regardless of the specific type of ion source employed, the ion source must be capable of continuous operation for extended periods of time, without the occurrence of "glitching" or other impairment or failure that would necessitate shut-down, maintenance or repair of the ion source. Accordingly, ion source lifetime is a critical characteristic of the ion implantation system.

More generally, the ion implantation system is desirably configured and operated to achieve a high wafer throughput at low operating cost of the system.

Silicon is a commonly employed deposition and/or dopant species in various semiconductor manufacturing operations. For example, silicon tetrafluoride, $SiF_4$, may be employed as a precursor material for producing silicon ions that are used to modify surfaces of integrated circuitry. $SiF_4$ can be used for various applications, such as pre-amorphization implants, and to effect the selectivity of metals deposition.

In consequence of the need to achieve long ion source lifetime, high wafer throughput, and low operating cost in the ion implantation system, the art is continually engaged in efforts to develop efficient precursor compositions enabling such high-performance operation.

SUMMARY

The present disclosure relates to silicon dopant compositions for ion implantation, and the use of such dopant compositions to achieve enhanced performance of an ion implantation system, such as increased lifetime of an ion source in an ion implantation system, higher beam currents, or other performance advantages.

In one aspect, the disclosure relates to a method of ion implanting silicon, comprising ionizing a silicon dopant composition to form ionized silicon, and contacting the ionized silicon with a substrate to implant silicon therein, wherein the silicon dopant composition comprises at least one silicon compound that is isotopically enriched above natural abundance in at least one of $^{28}Si$, $^{29}Si$, and $^{30}Si$, and wherein when the silicon dopant composition consists of silicon tetrafluoride enriched in $^{29}Si$, the level of enrichment is above 50 atomic % and up to 100 atomic %.

In another aspect, the disclosure relates to a dopant gas composition supply for ion implantation of silicon, said supply being selected from the group consisting of:
(A) a gas storage and dispensing vessel containing a silicon dopant composition comprising silicon dopant gas in mixture with supplemental gas comprising at least one of a diluent gas and a co-species gas, wherein the silicon dopant composition comprises at least one gaseous silicon compound that is isotopically enriched above natural abundance in at least one of $^{28}Si$, $^{29}Si$, and $^{30}Si$; and
(B) a gas supply kit comprising (i) a first gas storage and dispensing vessel containing silicon dopant gas, and (ii) a second gas storage and dispensing vessel holding supplemental gas comprising at least one of a diluent gas and a co-species gas, wherein at least one of the silicon dopant gas and, when present, a co-species gas, is isotopically enriched above natural abundance in at least one of $^{28}Si$, $^{29}Si$, and $^{30}Si$.

A further aspect of the disclosure relates to an ion implantation system, comprising an ion implanter arranged in gas-receiving flow communication with a dopant gas composition supply of the present disclosure.

Another aspect the disclosure relates to a method for enhancing operation of an ion implantation system, comprising providing for use in the ion implantation system a dopant gas composition supply of the present disclosure.

Other aspects, features and embodiments of the disclosure will be more fully apparent from the ensuing description and appended claims.

DETAILED DESCRIPTION

Figure 1:
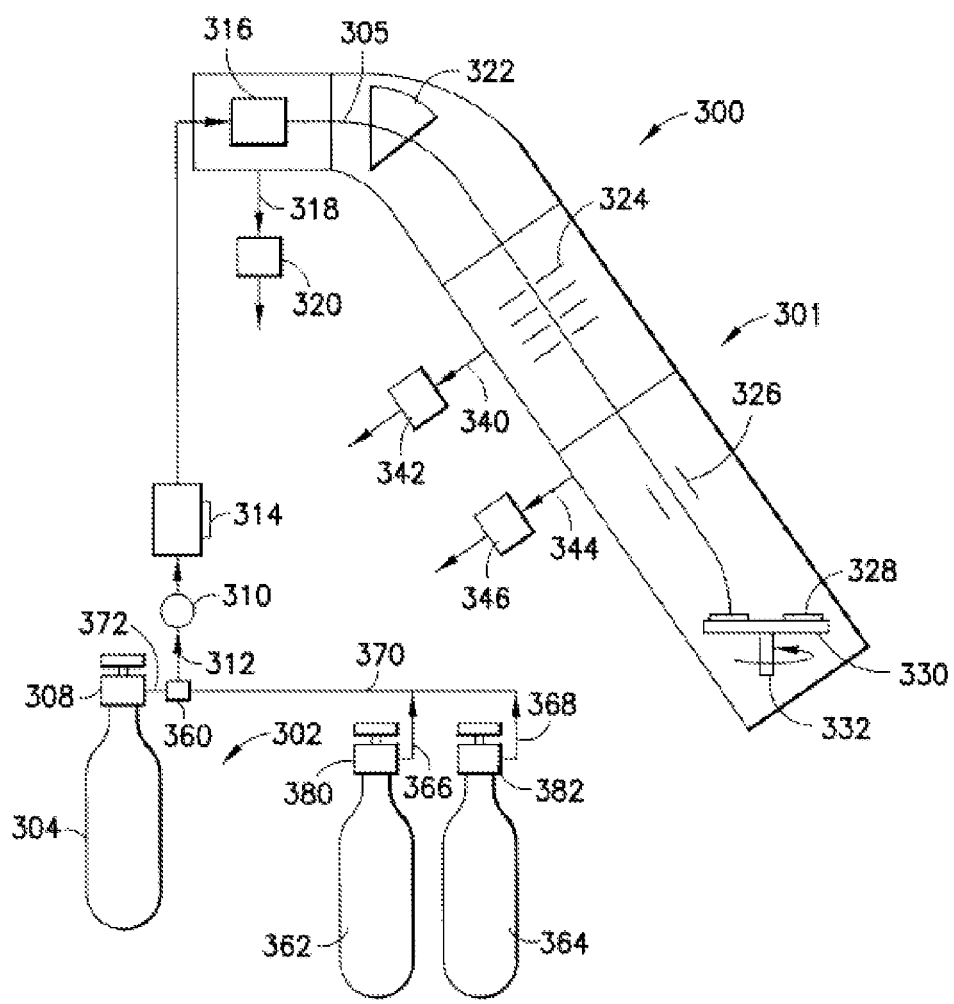
FIG. 1 is a schematic representation of an ion implant process system according to one aspect of the disclosure.

As used herein, the singular forms "a", "and", and "the" include plural referents unless the context clearly dictates otherwise.

The disclosure, as variously set out herein in respect of features, aspects and embodiments thereof, may in particular implementations be constituted as comprising, consisting, or consisting essentially of, some or all of such features, aspects and embodiments, as well as elements and components thereof being aggregated to constitute various further implementations of the invention. The disclosure is set out herein in various embodiments, and with reference to various features and aspects of the invention. The disclosure contemplates such features, aspects and embodiments in various permutations and combinations, as being within the scope of the disclosure. The disclosure may therefore be specified as comprising, consisting or consisting essentially of, any of such combinations and permutations of these specific features, aspects and embodiments, or a selected one or ones thereof.

The compounds, compositions, features, steps and methods of the disclosure may be further specified in particular embodiments by provisos or limitations excluding specific substituents, isotopes, moieties, structures, ingredients, characteristics, steps or conditions, as applicable, in relation to various specifications and exemplifications thereof set forth herein.

The present disclosure relates to silicon dopant compositions for ion implantation, and the use of such dopant compositions to achieve enhanced performance of an ion implantation system, as well as apparatus and methods for use of such silicon dopant compositions. Such enhanced performance may for example comprise increased lifetime of an ion source in the ion implantation system, higher beam currents, or other performance advantages, in relation to corresponding ion implantation systems lacking the isotopically enriched dopant gas composition of the present disclosure.

More specifically, the disclosure relates to silicon dopant compositions comprising one or more silicon-containing compounds that are isotopically enriched above natural abundance in one or more silicon isotopes. Silicon comprises the following naturally occurring isotopes at the listed atomic percentages, wherein all such isotopic percentages total to 100 atomic percent.

| Silicon Isotope | Natural Abundance, Atomic % |
|---|---|
| $^{28}Si$ | 92.2 |
| $^{29}Si$ | 4.7 |
| $^{30}Si$ | 3.1 |

As used herein, the term "isotopically enriched" or "enriched" in reference to a silicon dopant gas and/or co-species gas means that the dopant species in such gas(es) are varied from a naturally occurring isotopic distribution of the dopant species, so that a higher-than-natural abundance amount of at least one of $^{28}Si$, $^{29}Si$, and $^{30}Si$ is present. The term "isotopically enriched" is therefore to be understood as indicating an increased concentration, relative to natural abundance levels, of the particular isotopic species considered. The term "homoisotopic" in reference to a specific silicon isotopic species means that the gas or composition contains 100 atomic % of such specific silicon isotope.

In the silicon dopant compositions of the present disclosure, at least one naturally occurring silicon isotope is present in the composition at a level above its natural abundance. Many variations are possible. For example, the dopant composition may contain all three naturally occurring isotopes, with one or two of such isotopes being present at levels above natural abundance. Alternatively, the dopant composition may contain only a single one of such isotopes at 100% abundance. As a still further alternative, the dopant composition may contain two of such isotopes, wherein at least one is above natural abundance.

The silicon dopant compositions of the present disclosure may be provided in gas supply packages comprising gas supply vessel(s) containing the silicon dopant composition. For such purpose, the silicon dopant composition may be supplied in a single vessel containing silicon dopant gas, optionally in mixture with supplemental gas, or the silicon dopant composition may be provided in multiple vessels, including one vessel containing the silicon dopant gas, and another or others containing supplemental gas (e.g., with one of such other vessels containing a co-species and/or diluent gas, and a further one of such vessels containing same or different gases, to aggregately constitute the gas supply for the ion implantation system and process. The silicon dopant composition supply package may include vessels of various types, and may for example include adsorbent-based fluid storage and dispensing vessel(s) and/or pressure-regulated fluid storage and dispensing vessel(s), as further described hereafter. A variety of supplemental gas species can be employed in silicon dopant compositions of the present disclosure.

The isotopically enriched silicon dopant compositions of the present disclosure, when employed in ion implantation systems and processes, achieve enhanced performance, e.g., enhanced lifetime, higher beam currents, lower gas flow rates, etc., in relation to corresponding ion implantation systems and processes not using such isotopically enriched silicon dopant compositions.

As used herein, the term "dopant gas" refers to a gas-phase material including a dopant species, i.e., the species to be implanted in the ion implantation substrate, as coordinated or associated to a non-dopant component, such as a hydride, halide, organo or other moiety. Examples of silicon dopant gases include, without limitation, silicon tetrafluoride ($SiF_4$), silane ($SiH_4$), disilane ($Si_2H_6$), $C_1$-$C_8$ alkylsilanes (e.g., $SiH_3CH_3$, $SiH_2(CH_3)_2$, $SiH(CH_3)_3$, $Si(CH_3)_4$, $SiH_3(C_2H_5)$, $SiH_2(C_2H_5)_2$, $SiH(C_2H_5)_3$, $Si(C_2H_5)_4$, etc.), fluorosilanes (e.g., $SiHF_3$, $SiH_2F_2$, $SiH_3F$), and chlorosilanes (e.g., $SiCl_4$, $SiHCl_3$, $SiH_2Cl_2$, $SiH_3Cl$).

The term "supplemental gas" as used herein refers to a diluent gas or a co-species gas.

A diluent gas is a gas that does not contain the dopant species and is effective in mixture with the dopant gas to improve the lifetime and performance of an ion source processing such diluent gas-containing mixture with the dopant gas, as compared to the lifetime and performance of a corresponding ion source processing the dopant gas without the presence of the diluent gas. Examples of illustrative diluent gases include argon, hydrogen, fluorine, krypton, neon, helium, ammonia, amines, water, phosphine, arsine, germane, hydrogen selenide, hydrogen sulfide, methane, nitrogen, oxygen, carbon monoxide, xenon difluoride, diborane, and xenon.

A co-species gas is a gas that contains the same dopant species as the dopant gas, wherein such same dopant species is coordinated or associated to a non-dopant component that is different from the non-dopant component of the dopant gas.

For example, the dopant gas may be silicon tetrafluoride, (SiF$_4$), and the co-species gas may be silane, SiH$_4$. In various embodiments of such co-species compositions, the dopant gas as well as the co-species gas may be isotopically enriched above natural abundance in one or more silicon isotopes. In other embodiments, the co-species gas may contain silicon in a natural abundance and distribution of its naturally occurring isotopes. In still other embodiments, the co-species gas may be enriched above natural abundance in one or more silicon isotopes, while the dopant gas is of a natural abundance in the isotopic distribution of its silicon content.

The present disclosure in various embodiments relates to a method of ion implanting silicon, comprising ionizing a silicon dopant composition to form ionized silicon, and contacting the ionized silicon with a substrate to implant silicon therein, wherein the silicon dopant composition comprises at least one silicon compound that is isotopically enriched above natural abundance in at least one of $^{28}$Si, $^{29}$Si, and $^{30}$Si, and wherein when the silicon dopant composition consists of silicon tetrafluoride enriched in $^{29}$Si, the level of enrichment is above 50 atomic % and up to 100 atomic %.

In such method, the silicon dopant composition can comprise (i) an above-referenced silicon compound in gaseous form as a silicon dopant gas, and (ii) a supplemental gas including at least one of a co-species gas and a diluent gas.

The method may be carried out with the silicon dopant composition being ionized using an ionization apparatus to generate an ion beam of silicon ions, and with the ion beam being accelerated by electric field to implant silicon in the substrate in the contacting operation. Alternatively, the ionized silicon may be contacted with the substrate in a plasma immersion process to implant silicon therein. As indicated in the preceding discussion, the silicon dopant composition can comprise a silicon compound selected from the group consisting of silicon tetrafluoride (SiF$_4$), silane (SiH$_4$), disilane (Si$_2$H$_6$), C$_1$-C$_8$ alkylsilanes, fluorosilanes, and chlorosilanes.

The method in specific embodiments may be carried out with a silicon compound that is isotopically enriched above natural abundance in $^{28}$Si, e.g., silicon tetrafluoride, isotopically enriched in $^{28}$Si in a range of concentration that is greater than 92.3 atomic % and up to 100 atomic %. The silicon tetrafluoride in specific embodiments may be homoisotopic in $^{28}$Si.

The supplemental gas used in silicon dopant compositions of the present disclosure may be of any suitable type, and may for example comprise a diluent gas selected from the group consisting of argon, hydrogen, fluorine, krypton, neon, helium, ammonia, water, phosphine, arsine, germane, hydrogen selenide, hydrogen sulfide, nitrogen, oxygen, carbon monoxide, xenon difluoride, diborane, methane, and xenon.

A wide variety of dopant gas compositions may be employed in the broad practice of the present disclosure, including dopant gas compositions comprising a gas composition selected from the group consisting of:

(i) isotopically enriched silicon tetrafluoride with xenon and hydrogen;
(ii) isotopically enriched silicon tetrafluoride with silane;
(iii) isotopically enriched silicon tetrafluoride and isotopically enriched silane;
(iv) isotopically enriched silicon tetrafluoride with argon;
(v) isotopically enriched silicon tetrafluoride with disilane;
(vi) isotopically enriched silicon tetrafluoride and isotopically enriched disilane;
(vii) isotopically enriched silicon tetrafluoride with hydrogen;
(viii) isotopically enriched silicon tetrafluoride with ammonia;
(ix) isotopically enriched silicon tetrafluoride with ammonia and xenon;
(x) isotopically enriched silicon tetrafluoride with hydrogen and krypton;
(xi) isotopically enriched silicon tetrafluoride with ammonia and krypton;
(xii) isotopically enriched silicon tetrafluoride with nitrogen;
(xiii) isotopically enriched silicon tetrafluoride with nitrogen and xenon;
(xiv) isotopically enriched silicon tetrafluoride with nitrogen and krypton; and
(xv) isotopically enriched silicon tetrafluoride with one or more of the following: hydrogen, nitrogen, ammonia, xenon, and argon.

The disclosure further contemplates a dopant gas composition supply for ion implantation of silicon, in which the supply is selected from the group consisting of:

(A) a gas storage and dispensing vessel containing a silicon dopant composition comprising silicon dopant gas in mixture with supplemental gas comprising at least one of a diluent gas and a co-species gas, wherein the silicon dopant composition comprises at least one gaseous silicon compound that is isotopically enriched above natural abundance in at least one of $^{28}$Si, $^{29}$Si, and $^{30}$Si; and (B) a gas supply kit comprising (i) a first gas storage and dispensing vessel containing silicon dopant gas, and (ii) a second gas storage and dispensing vessel holding supplemental gas comprising at least one of a diluent gas and a co-species gas, wherein at least one of the silicon dopant gas and, when present, a co-species gas, is isotopically enriched above natural abundance in at least one of $^{28}$Si, $^{29}$Si, and $^{30}$Si.

The dopant gas composition supply may comprise a silicon compound selected from the group consisting of silicon tetrafluoride (SiF$_4$), silane (SiH$_4$), disilane (Si$_2$H$_6$), C$_1$-C$_8$ alkylsilanes, fluorosilanes, and chlorosilanes. In specific embodiments, the silicon compound is isotopically enriched above natural abundance in $^{28}$Si, e.g., silicon tetrafluoride, isotopically enriched in $^{28}$Si in a range of concentration that is greater than 92.3 atomic % and up to 100 atomic %. The silicon tetrafluoride may be homoisotopic in $^{28}$Si in specific implementations of the dopant gas composition supply.

The dopant gas composition supply in various embodiments includes a supplemental gas comprising a diluent gas selected from the group consisting of argon, hydrogen, fluorine, krypton, neon, helium, ammonia, amines, water, phosphine, arsine, germane, hydrogen selenide, hydrogen sulfide, nitrogen, oxygen, carbon monoxide, xenon difluoride, diborane, methane, and xenon. The dopant gas composition supply in particular applications may be constituted to provide a dopant gas composition comprising a gas composition selected from the group consisting of:

(i) isotopically enriched silicon tetrafluoride with xenon and hydrogen;
(ii) isotopically enriched silicon tetrafluoride with silane;

(iii) isotopically enriched silicon tetrafluoride and isotopically enriched silane;
(iv) isotopically enriched silicon tetrafluoride with argon;
(v) isotopically enriched silicon tetrafluoride with disilane;
(vi) isotopically enriched silicon tetrafluoride and isotopically enriched disilane;
(vii) isotopically enriched silicon tetrafluoride with hydrogen;
(viii) isotopically enriched silicon tetrafluoride with ammonia;
(ix) isotopically enriched silicon tetrafluoride with ammonia and xenon;
(x) isotopically enriched silicon tetrafluoride with hydrogen and krypton;
(xi) isotopically enriched silicon tetrafluoride with ammonia and krypton;
(xii) isotopically enriched silicon tetrafluoride with nitrogen;
(xiii) isotopically enriched silicon tetrafluoride with nitrogen and xenon;
(xiv) isotopically enriched silicon tetrafluoride with nitrogen and krypton; and
(xv) isotopically enriched silicon tetrafluoride with one or more of the following: hydrogen, nitrogen, ammonia, xenon, and argon.

The disclosure in a further aspect relates to an ion implantation system, comprising an ion implanter arranged in gas-receiving flow communication with a dopant gas composition supply as variously described above. In the ion implantation system, the ion implanter may be adapted to:
(A) ionize the silicon dopant composition from said dopant gas composition supply and form ionized silicon, and to contact the ionized silicon with a substrate to implant silicon therein; and
(B) (i) generate an ion beam of said ionized silicon, and accelerate the ion beam by electric field to the substrate for implantation of silicon therein, or (ii) conduct a plasma immersion process for implantation of silicon in the substrate.

The disclosure further contemplates a method for enhancing operation of an ion implantation system, comprising providing for use in the ion implantation system a dopant gas composition supply as variously described above. Such method may be carried out in a variety of ways. For example, the dopant gas composition supply may comprise a silicon compound selected from the group consisting of silicon tetrafluoride (SiF$_4$), silane (SiH$_4$), disilane (Si$_2$H$_6$), C$_1$-C$_8$ alkylsilanes, fluorosilanes, and chlorosilanes. The silicon compound in specific embodiments may comprise silicon tetrafluoride (SiF$_4$), isotopically enriched above natural abundance in $^{28}$Si, in a range of concentration that is greater than 92.3 atomic % and up to 100 atomic %, e.g., silicon tetrafluoride that is homoisotopic in $^{28}$Si. A supplemental gas may be employed that comprises a diluent gas selected from the group consisting of argon, hydrogen, fluorine, krypton, neon, helium, ammonia, amines, water, phosphine, arsine, germane, hydrogen selenide, hydrogen sulfide, nitrogen, oxygen, carbon monoxide, xenon difluoride, diborane, methane, and xenon.

In specific embodiments, the method may be carried out, with the dopant gas composition comprising a gas composition selected from the group consisting of:
(i) isotopically enriched silicon tetrafluoride with xenon and hydrogen;
(ii) isotopically enriched silicon tetrafluoride with silane;
(iii) isotopically enriched silicon tetrafluoride and isotopically enriched silane;
(iv) isotopically enriched silicon tetrafluoride with argon;
(v) isotopically enriched silicon tetrafluoride with disilane;
(vi) isotopically enriched silicon tetrafluoride and isotopically enriched disilane;
(vii) isotopically enriched silicon tetrafluoride with hydrogen;
(viii) isotopically enriched silicon tetrafluoride with ammonia;
(ix) isotopically enriched silicon tetrafluoride with ammonia and xenon;
(x) isotopically enriched silicon tetrafluoride with hydrogen and krypton;
(xi) isotopically enriched silicon tetrafluoride with ammonia and krypton;
(xii) isotopically enriched silicon tetrafluoride with nitrogen;
(xiii) isotopically enriched silicon tetrafluoride with nitrogen and xenon;
(xiv) isotopically enriched silicon tetrafluoride with nitrogen and krypton; and
(xv) isotopically enriched silicon tetrafluoride with one or more of the following: hydrogen, nitrogen, ammonia, xenon, and argon.

In other aspects, the disclosure relates to an ion implantation process, comprising flowing a dopant composition to an ion source for generation of ionic dopant species for implantation, wherein the dopant composition is selected from the group consisting of:
(i) silicon compounds isotopically enriched to above natural abundance level of at least one silicon isotope of mass 28, 29, or 30, e.g., wherein the isotopically enriched level of said at least one silicon isotope is greater than 92.2% for mass 28 silicon isotope, greater than 4.7% for mass 29 silicon isotope, and greater than 3.1% for mass 30 silicon isotope, and wherein when the silicon compound is silicon tetrafluoride enriched only in silicon isotope of mass 29, the enrichment level is greater than 50% and up to 100%; and
(ii) dopant gas formulations comprising a silicon dopant gas and a supplemental gas, wherein the supplemental gas includes at least one of a diluent gas and a co-species gas, and wherein at least one of the dopant gas and, when present, a co-species gas, is isotopically enriched above natural abundance in at least one silicon isotope.

In various embodiments, the dopant composition can be selected from the group consisting of silicon compounds isotopically enriched to above natural abundance level of at least one silicon isotope of mass 28, 29, or 30, wherein when the silicon compound is silicon tetrafluoride enriched only in silicon isotope of mass 29, the enrichment level is greater than 50% and up to 100%.

The ion implantation process in other embodiments may be practiced with the silicon compound comprising at least one of silicon tetrafluoride and silane. For example, the silicon compound may comprise silicon tetrafluoride, in which silicon in the silicon tetrafluoride can have: an isotopically enriched level of mass 28 silicon isotope that is greater than 92.2% and up to 100%; an isotopically enriched level of mass 29 silicon isotope that is greater than 50% and up to 100%; or an isotopically enriched level of mass 30 silicon isotope that is greater than 3.1% and up to 100%.

In other embodiments, the silicon compound comprises silicon tetrafluoride that is isotopically enriched in mass 29 silicon isotope, as well as being isotopically enriched in at least one of the mass 28 silicon isotope and mass 30 silicon isotope. In such compositions, the isotopic enrichment in the mass 29 silicon isotope is greater than 4.7%, with all atomic percentages of all silicon isotopes in the composition totaling to 100 atomic percent.

In various embodiments in which all three naturally occurring silicon isotopes ($^{28}$Si, $^{29}$Si, and $^{30}$Si) are present, two of such isotopes may be present in excess of natural abundance amounts, with the third being present in an amount that is below natural abundance amount of such isotope, since the total of all atomic percent amounts of all such isotopes must total to 100 atomic percent. In other embodiments, all three naturally occurring silicon isotopes may be present, with only one of such isotopes being present in an amount above natural abundance level, and with the other two isotopes being present at below natural abundance amounts, or with one of such other isotopes being present at natural abundance amount, and the second of such other isotopes being present at below natural abundance amount. It will be recognized that all such variations are possible.

It will also be recognized that compositions of the present disclosure may utilize homoisotopic silicon-containing gas, in which all or substantially all of the silicon atoms are of a single isotopic species ($^{28}$Si, $^{29}$Si, or $^{30}$Si). Such homoisotopic dopant gases can substantially increase beam current and achieve marked improvement in performance and operating lifetime of the ion implanter tool. For example, use of silicon tetrafluoride that is homoisotopic in $^{28}$Si can achieve increases in beam current on the order of 10% as compared to use in a corresponding ion implantation system of silicon tetrafluoride that is of natural abundance as regards the constituent isotopic species of silicon therein.

As an alternative to achievement of improvements in beam current, the use of isotopically enriched dopant gas compositions in accordance with the present disclosure enables the flow rate of the isotopically enriched silicon material to be reduced so that source life in the implanter system is improved. The actual reduction in flow rate can be determined for specific needs of an implant facility, as variable between a circumstance in which maximum beam current improvement is achieved, to a circumstance in which a maximum reduction in flow rate is achieved (for a same beam current associated with utilization of natural abundance material in the ion implanter). The specific trade-off in flow rate reduction vs. improved lifetime can be readily determined, within the skill of the art, based on the disclosure herein, to provide a desired performance improvement and economic advantage in a specific ion implantation facility.

The ion implantation process broadly described above can be carried out in other embodiments in which the silicon dopant composition is selected from the group consisting of silicon dopant gas compositions comprising a silicon dopant gas and a supplemental gas, wherein the supplemental gas includes at least one of a diluent gas and a co-species gas, and wherein at least one of the dopant gas and, when present, a co-species gas, is isotopically enriched above natural abundance in at least one of mass 28, mass 29, and mass 30 silicon isotopes. In various embodiments, at least one of the silicon dopant gas and, when present, the silicon co-species gas, is isotopically enriched above natural abundance level of at least one silicon isotope of mass 28, 29, or 30. Illustrative examples of such isotopically enriched silicon compounds include: silicon compounds isotopically enriched to greater than 92.2% in mass 28 silicon isotope; silicon compounds isotopically enriched to greater than 4.7% in mass 29 silicon isotope; and silicon compounds isotopically enriched to greater than 3.1% in mass 30 silicon isotope.

The silicon dopant gas and silicon co-species gas can be of any suitable types that are useful in ion implantation applications. By way of example, the silicon dopant gas and silicon co-species gas can be selected from among: $SiF_4$; $SiH_4$; and $Si_2H_6$; methyl silanes, e.g., $SiH_3CH_3$, $SiH_2(CH_3)_2$, $SiH(CH_3)_3$, and $Si(CH_3)_4$; fluorosilanes, e.g., $SiHF_3$, $SiH_2F_2$, and $SiH_3F$; and chlorosilanes, e.g., $SiHCl_3$, $SiH_2Cl_2$, and $SiH_3Cl$.

In other embodiments, the supplemental gas may include a diluent gas, e.g., at least one gas species selected from the group consisting of argon, hydrogen, fluorine, krypton, neon, helium, ammonia, amines, water, phosphine, arsine, germane, hydrogen selenide, hydrogen sulfide, methane, nitrogen, oxygen, carbon monoxide, xenon difluoride, diborane, and xenon. Still other embodiments may include a supplemental gas comprising a co-species gas as well as a diluent gas.

In specific embodiments the dopant composition may comprise at least one of silicon tetrafluoride, silane, and disilane, enriched above natural abundance in at least one silicon isotope of mass 28, mass 29, or mass 30, with a diluent gas comprising at least one diluent gas species selected from the group consisting of argon, hydrogen, fluorine, krypton, neon, helium, ammonia, amines, water, phosphine, arsine, germane, hydrogen selenide, hydrogen sulfide, methane, nitrogen, oxygen, carbon monoxide, xenon difluoride, diborane, and xenon.

The silicon dopant composition in any embodiments of the process can include a gas composition selected from the group consisting of:
(i) isotopically enriched silicon tetrafluoride with xenon and hydrogen;
(ii) isotopically enriched silicon tetrafluoride with silane;
(iii) isotopically enriched silicon tetrafluoride and isotopically enriched silane;
(iv) isotopically enriched silicon tetrafluoride with argon;
(v) isotopically enriched silicon tetrafluoride with disilane;
(vi) isotopically enriched silicon tetrafluoride and isotopically enriched disilane;
(vii) isotopically enriched silicon tetrafluoride with hydrogen;
(viii) isotopically enriched silicon tetrafluoride with ammonia;
(ix) isotopically enriched silicon tetrafluoride with ammonia and xenon;
(x) isotopically enriched silicon tetrafluoride with hydrogen and krypton;
(xi) isotopically enriched silicon tetrafluoride with ammonia and krypton;
(xii) isotopically enriched silicon tetrafluoride with nitrogen;
(xiii) isotopically enriched silicon tetrafluoride with nitrogen and xenon;
(xiv) isotopically enriched silicon tetrafluoride with nitrogen and krypton; and
(xv) isotopically enriched silicon tetrafluoride with one or more of the following: hydrogen, nitrogen, ammonia, xenon, and argon.

In various ion implantation embodiments, the dopant gas and co-species gas are flowed in mixture with one another to the ion source for generation of ionic dopant species for implantation. Other embodiments of the process are carried out in which the dopant gas and co-species gas are sequentially flowed to the ion source for generation of ionic dopant species for implantation.

The disclosure also contemplates embodiments in which an isotopically enriched silicon dopant gas is flowed to an ion implanter concurrently with another dopant gas, either in mixture, or as discrete streams that are separately fed to the vacuum chamber of the implanter.

In the ion implantation process, the ion source in one embodiment can be operated according to the following methodology: flowing sequentially to the ion source different dopant materials comprised in said dopant composition; monitoring cathode bias power during operation of the ion source during the sequential flow of the different dopant materials to the ion source; and in response to the monitored cathode bias power, modulating flow rate of at least one of the sequentially supplied dopant compositions, to extend operating lifetime of the ion source, cathode and/or one or more other components of the ion source.

The disclosure in another aspect relates to a method of improving performance and lifetime of an ion source arranged to generate ionic doping species for ion implantation from a dopant feedstock, comprising generating such ionic doping species from any of the dopant compositions of the present disclosure, as variously described herein. In one embodiment of such method, a dopant gas and co-species gas are flowed in mixture with one another to the ion source for generation of ionic dopant species for implantation. In another embodiment of such method, a dopant gas and co-species gas are sequentially flowed to the ion source for generation of ionic dopant species for implantation.

Ion implantation systems of varied types are contemplated, comprising an ion source and a dopant composition source arranged for supplying dopant composition to said ion source, wherein the dopant composition source comprises any of the dopant compositions as variously described herein. In such ion implantation system, the dopant composition may comprise dopant gas and co-species gas, and the dopant composition source may be arranged to flow the dopant gas and co-species gas in mixture with one another to said ion source for supplying dopant composition thereto. Alternatively, the dopant composition source may be arranged for sequentially flowing dopant gas and co-species gas to the ion source for supply of dopant composition thereto.

A further aspect of the disclosure relates to a dopant feedstock apparatus, comprising a vessel having interior volume, and a dopant feedstock in the interior volume, wherein the dopant feedstock comprises any of the dopant compositions as variously described herein.

The disclosure relates in another aspect to a method of increasing at least one of source life and turbo pump life in an ion implantation system in which silicon ions are implanted in a substrate. The method comprises ionizing a silicon-containing dopant gas in an ionization chamber of the ion implantation system, wherein the silicon-containing dopant gas comprises a mixture of silicon tetrafluoride and one or more of hydrogen, argon, nitrogen, and helium, wherein the dopant gas is isotopically enriched in at least one isotopic Si species.

For example, silicon tetrafluoride may be present in such mixture at a concentration in a range of from 5 to 98% by volume, based on total volume of the mixture. In applications in which particularly high beam currents are to be achieved, the silicon tetrafluoride may be present in the mixture at a concentration that is in a range of from 80 to 98% by volume, based on total volume of the mixture.

The disclosure in a further aspect relates to a method of increasing ion source life in an ion implantation system wherein silicon tetrafluoride is introduced and ionized in the ion source. The method comprises introducing ammonia with the silicon tetrafluoride to the ion source, and wherein the silicon tetrafluoride is isotopically enriched in at least one Si isotopic species. In such method, the ammonia and silicon tetrafluoride may be provided in a mixture in a supply vessel from which the mixture is dispensed for introduction thereof to the ion source. Alternatively, in such method, the ammonia and silicon tetrafluoride may be provided in separate supply vessels from which they are dispensed for introduction thereof to the ion source. As a still further embodiment, the ammonia and silicon tetrafluoride may be mixed with one another in the ion source after introduction thereof to the ion source. Amines may be employed in place of or addition to ammonia in such methods.

Another variant of such method involves introducing xenon to the ion source. The xenon may be introduced in mixture with ammonia and/or silicon tetrafluoride.

The disclosure contemplates a variety of silicon dopant gas compositions comprising a silicon dopant gas and a supplemental gas, wherein the supplemental gas includes at least one of a diluent gas and a co-species gas, and wherein at least one of the silicon dopant gas and, when present, a co-species gas, is isotopically enriched above natural abundance level of at least one silicon isotope of mass 28, 29, or 30.

Dopant compositions of the disclosure are effective to improve the performance of an implantation process, as compared to the performance of a corresponding process that does not utilize isotopically enriched dopant gas and/or isotopically enriched supplemental gas. The performance improvement may relate to higher beam current, longer ion source life, longer mean time between successive maintenance events, reduced deposition of material on surfaces in the ion implanter, or other performance improvement, in relation to the corresponding implantation process with a dopant gas composition lacking the isotopically enriched species in the dopant gas composition, i.e., a dopant gas composition containing a natural abundance of isotopic species.

In various specific embodiments, the dopant composition may contain at least one silicon compound that is enriched above natural abundance level in $^{28}$Si, e.g., with a concentration of $^{28}$Si that is greater than 92.2%, such as greater than 93%, 94%, 95%, 96%, 97%, 98%, 99%, or 99.9%, and up to 100%. In other specific embodiments, the dopant composition may contain at least one silicon compound that is enriched above natural abundance level in $^{29}$Si, e.g., with concentration of $^{29}$Si that is greater than 4.7%, such as greater than 5%, 7%, 10%, 12%, 15%, 20%, 25%, 30%, 35%, 40%, 50%, 51%, 52%, 53%, 54%, 55%, 56%, 57%, 58%, 59%, 60%, 70%, 80%, 90%, 95%, 96%, 97%, 98%, 99%, or 99.9%, and up to 100%. In still other specific embodiments, the dopant opposition may contain at least one silicon compound that is enriched above natural abundance level in $^{30}$Si, e.g., with a concentration of $^{30}$Si that is greater than 3.1%, such as greater than 3.5%, 4%, 5%, 7%, 10%, 12%, 15%, 20%, 25%, 30%, 35%, 40%, 50%, 60%, 70%, 80%, 90%, 95%, 96%, 97%, 98%, 99%, or 99.9%, and up to 100%.

The present disclosure thus broadly contemplates isotopically enriched silicon dopant gases, and/or isotopically enriched co-species gases, in which the concentration of a beneficial isotope is increased in relation to its natural occurrence in such dopant and/or co-species gases, to such extent as to improve the performance of the ion implantation system, in relation to a corresponding system in which the dopant and/or co-species gases are not isotopically adjusted from natural abundance concentration levels.

In embodiments in which the silicon dopant gas composition includes a dopant gas and a co-species gas, such respective gases may be provided in the ion implantation system so that they are flowed to the ion source for supply thereof, in mixture with one another, or in co-flow relationship in which separate flow lines or provided through which gases from their respective sources are flowed to the ion implantation system. Alternatively, such respective gases can be sequentially flowed to the ion implantation system. Such sequential operation may be conducted in any suitable manner, utilizing equal time-based flows of the respective dopant gas and co-species gas, or alternatively, the respective time-based flows may be different in respect of each other, or otherwise modulated to provide a doped substrate of desired character.

The substrate that is ion implanted with ionic species in accordance with the present disclosure, may be of any suitable type.

The substrate may comprise silicon, silicon carbide, gallium nitride, or any other suitable substrate composition. Substrates may include microelectronic device substrates, i.e., substrates utilized to prepare microelectronic structures for manufacturing of microelectronic devices or device precursor components.

In other embodiments, the substrate may be implanted for manufacture of products such as flat-panel displays and solar panels. It will be recognized that the disclosure is applicable to ion implantation applications of any suitable character.

The dopant composition may be supplied for use in a storage and dispensing vessel having an interior volume for holding a dopant composition therein, wherein the dopant composition may be of any suitable type as described. Such dopant composition storage and dispensing vessel may be arranged for coupling with an ion source, e.g., by means of suitable flow circuitry containing appropriate instrumentation and control components for effecting appropriate flow of dopant composition to the ion source. The storage and dispensing vessel may comprise an adsorbent-based containing vessel contains a solid physical adsorbent in its interior volume, in which the adsorbent has a sorptive affinity for the dopant composition. The dopant composition thereby is sorptively retained on the adsorbent during storage, and desorbs from the adsorbent under dispensing conditions so that the desorbed dopant composition can be discharged from the vessel for flow to the ion implantation system. The physical adsorbent in such vessels may comprise a carbon adsorbent, e.g., of a type commercially available from ATMI, Inc. (Danbury, Conn., USA) under the trademark BRIGHTBLACK. Alternatively, any other solid physical adsorbent having suitable sorptive affinity for the dopant gas can be used, as well as any other storage medium such as an ionic liquid in which the dopant gas can be stored and from which the dopant gas can be dispensed under dispensing conditions. Adsorbent-based vessels of such type are commercially available from ATMI, Inc. (Danbury, Conn., USA) under the trademarks SDS and SAGE.

Alternatively, the dopant composition may be provided in a vessel of an internally pressure-regulated type, containing one or more pressure regulators in the interior volume of the vessel. Such pressure-regulated vessels are commercially available from ATMI, Inc. (Danbury, Conn., USA) under the trademark VAC. Vessels of such pressure-regulated type further containing an adsorbent in the interior volume thereof are also commercially available from ATMI, Inc. (Danbury, Conn., USA) under the trademark VACSorb.

As a still further alternative, the gas supply vessel may contain the dopant composition in the form of a solid-phase dopant source material that is volatilized, e.g., by heating of the vessel and/or its contents, to generate the dopant gas as a vaporization or sublimation product. Solid delivery vessels of such type are commercially available from ATMI, Inc. (Danbury, Conn., USA) under the trademark ProE-vap.

The disclosure in further embodiments contemplates a gas supply kit for an ion implantation system, comprising (i) a first gas storage and dispensing vessel holding a silicon dopant source gas, and (ii) a second gas storage and dispensing vessel holding a supplemental gas comprising at least one of a diluent gas and a co-species gas, wherein at least one of the dopant gas and, when present, a co-species gas, is isotopically enriched above natural abundance level in at least one silicon isotope.

The disclosure relates in other aspects to a method for enhancing operation of an ion implantation system, comprising providing for use in the ion implantation system (i) a first gas storage and dispensing vessel holding a silicon dopant source gas, and (ii) a second gas storage and dispensing vessel holding a supplemental gas comprising at least one of a diluent gas and a co-species gas, wherein at least one of the dopant gas and, when present, a co-species gas, is isotopically enriched above natural abundance level in at least one silicon isotope.

In such gas supply kit and enhancement method aspects, the dopant gas and co-species gas may both be homoisotopic in a same single silicon isotopic species, e.g., $^{28}$Si, in the supplied dopant gas and co-species gas compounds.

The gas supply kit and enhancement methodology may utilize the dopant gas and a diluent gas in the respective vessels, wherein the dopant gas is isotopically enriched above natural abundance in at least one of the naturally occurring silicon isotopes. For example, the dopant gas may comprise a gaseous silicon compound that is homoisotopic, e.g., in $^{28}$Si. The diluent gas may comprise any suitable gas species or mixture, and may for example comprise argon, hydrogen, fluorine, krypton, neon, helium, ammonia, amines, water, phosphine, arsine, germane, hydrogen selenide, hydrogen sulfide, nitrogen, oxygen, carbon monoxide, xenon difluoride, diborane, methane, and xenon, or other suitable gas or gases.

Referring now to the drawings, FIG. 1 is a schematic representation of an ion implant process system according to one aspect of the disclosure.

The ion implant process system 300 includes a storage and dispensing vessel 302 containing having an interior volume holding a silicon dopant gas that is supplied for silicon ion implantation doping of a substrate 328 in the illustrated ion implant chamber 301. The storage and dispensing vessel may be of a type containing a sorbent medium on which the silicon dopant gas is physically adsorbed for storage of the gas, with the gas being desorbed from the sorbent medium, under dispensing conditions, for discharge from the vessel. The sorbent medium may comprise a solid-phase carbon adsorbent material.

In FIG. 1, the storage and dispensing vessel 302 comprises a cylindrical vessel wall 304 enclosing an interior volume holding the dopant gas in an adsorbed state, a free gas state, or a liquefied gas state.

The storage and dispensing vessel 302 includes a valve head 308 coupled in gas flow communication via a dispensing line 372 with a mixing chamber 360 (which is optional), joined in turn to discharge line 312. A pressure sensor 310 may be disposed in the line 312, together with a mass flow controller 314; other optional monitoring and sensing components may be coupled with the line, and interfaced with control means such as actuators, feedback and computer control systems, cycle timers, etc.

The mixing chamber 360 also if used may be joined in flow communication with gas feed line 370, to which are coupled supplemental gas supply vessels 362 and 364, each of which may be of a same or different type relative to one another, and which may be of a same or different type in relation to vessel 302 above described. Vessel 362 may for example contain a diluent gas, and vessel 364 may for example contain a co-species gas, arranged so that dopant gas mixtures can be prepared, containing the dopant gas in combination with the diluent gas and/or the co-species gas.

Supplemental vessel 362 is formed with a main container portion to which is secured a valve head 380 that is in turn coupled with supplemental vessel feed line 366. In like manner, supplemental vessel 364 is formed with a main container portion to which is secured valve head 382. Valve head 382 is coupled to supplemental vessel feed line 368. Feed lines 366 and 368 by such arrangement deliver diluent and/or co-species gas(es) to the mixing chamber 360, to provide a dopant gas mixture containing diluent and/or co-species gas(es), for passage to the ion source of the implanter. For such purpose, the supplemental vessel feed lines 366 and 368, and dispensing line 372 may be equipped with suitable valves, controllers and/or sensors for manually or automatically controlling the flow or other characteristics of the materials dispensed from the vessels and such valves, controllers and/or sensors can be coupled with or connected to the corresponding feed/dispensing lines in any suitable manner.

Such valves may in turn be coupled with valve actuators operatively linked to a central processor unit (CPU). The CPU may be coupled in signal communication relationship with the aforementioned controllers and/or sensors, and programmably arranged to control the rates, conditions and amounts of fluids dispensed from each of the vessels in relation to each other, so that the dopant gas mixture flowed from the mixing chamber 360 in line 312 has a desired composition, temperature, pressure and flow rate for carrying out the ion implantation operation.

In the illustrated system 300, the ion implant chamber 301 contains an ion source 316 receiving the dispensed silicon dopant gas mixture from line 312 and generates an ion beam 305. The ion beam 305 passes through the mass analyzer unit 322 which selects the ions needed and rejects the non-selected ions.

The selected ions pass through the acceleration electrode array 324 and then the deflection electrodes 326. The resulting focused ion beam is impinged on the substrate element 328 disposed on the rotatable holder 330 mounted on spindle 332. The ion beam of dopant ions is used to dope the substrate as desired to form a doped structure.

The respective sections of the ion implant chamber 301 are exhausted through lines 318, 340 and 344 by means of pumps 320, 342 and 346, respectively.

Alternatively, the ion implant chamber 301 could be a plasma immersion chamber adapted to carry out implantation of silicon in a substrate by a suitable plasma immersion process.

Figure 2:
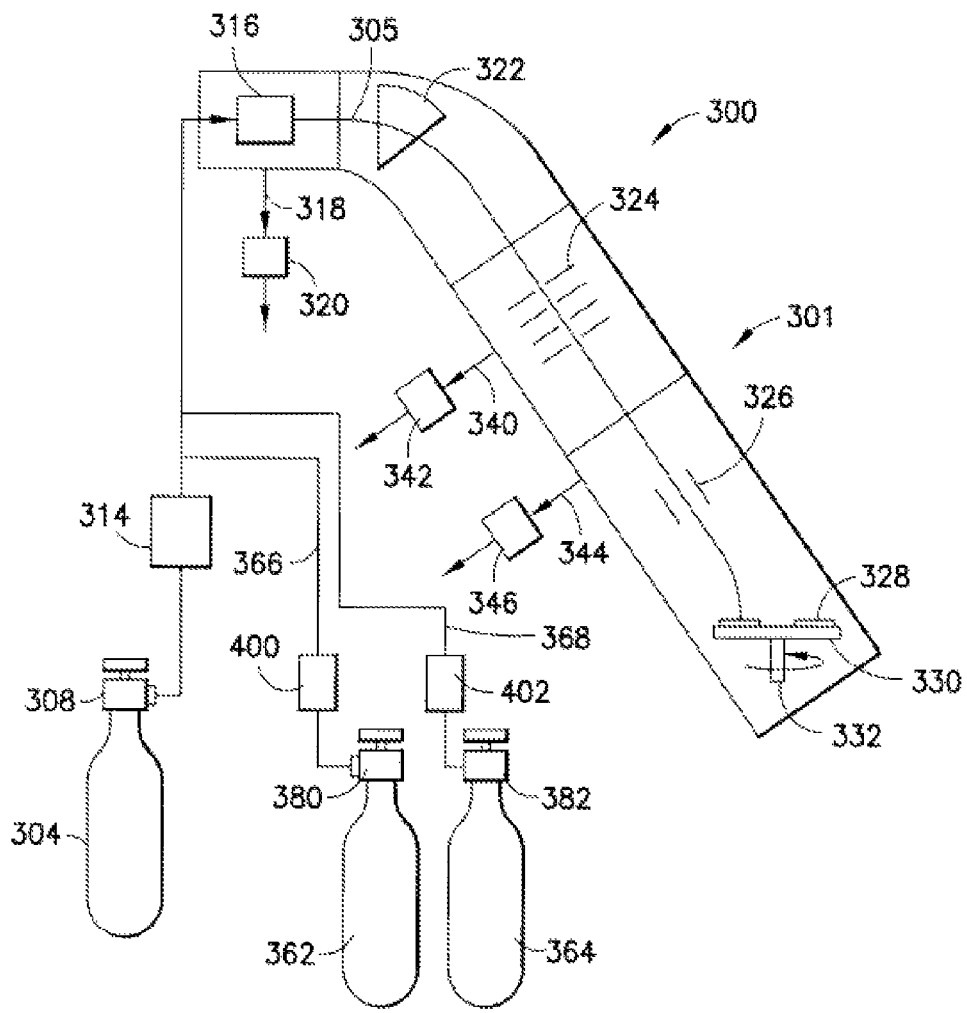
FIG. 2 is a schematic representation of an ion implant process system according to another aspect of the disclosure.

FIG. 2. is a schematic representation of an ion implant process system according to another aspect of the disclosure. The FIG. 2 system is numbered correspondingly with respect to the same components and features of FIG. 1 but the FIG. 2 system utilizes the respective dopant gas and supplemental gas vessels in a flow circuitry arrangement wherein each of the vessels 304, 362 and 364 has a separate mass flow controller 314, 400 and 402, respectively, in its dispensing line. By this arrangement, the flow of gas from each of the respective vessels is modulated by a dedicated mass flow controller in the associated dispensing line, to achieve selected flow rates or flow rate ratios of the respective gases in operation. The respective mass flow controllers may be operatively linked with a central processor unit (CPU) by which the respective mass flow controllers can be adjusted in operation as necessary or desirable to achieve optimal operation of the system.

In a further aspect of the present disclosure, the dopant gas may be supplied in the first instance in a mixture containing one or more supplemental gas(es), i.e., a diluent and/or co-species gas, in which the mixture of dopant gas and supplemental gas is contained in a single supply vessel, from which the gas mixture can be dispensed and flowed to the ion source of the ion implantation system. For example, in the FIG. 1 system, the vessel 302 can constitute a single gas supply vessel (with supplemental vessels 362 and 364 being absent) containing the silicon dopant gas and supplemental gas mixture.

Such approach may be utilized to provide silicon tetrafluoride as a dopant gas in a mixture comprising hydrogen, an inert gas or other diluent gas, as a co-packaged mixture that can be provided from a single supply vessel.

As an illustrative example of isotopically enriched silicon tetrafluoride gas mixtures that can be advantageously used in the broad practice of the present disclosure, as provided in a single supply vessel, the silicon tetrafluoride-containing gas composition can comprise from 5 to 35 volume % silicon tetrafluoride, based on the total volume of the composition, with the balance being one or more of hydrogen, argon, nitrogen, and helium, wherein the silicon tetrafluoride is isotopically enriched in at least one of the naturally occurring silicon isotopes, e.g., $^{28}$Si.

In another aspect, the present disclosure relates to use of ammonia as a co-flow gas with silicon tetrafluoride, to increase source life in ion implantation systems in which silicon tetrafluoride is used as a dopant gas, wherein the silicon tetrafluoride is isotopically enriched in at least one Si isotopic species, e.g., $^{28}$Si.

By using ammonia as a supplemental gas in mixture with silicon tetrafluoride when implanting silicon, the nitrogen and hydrogen constituents of ammonia ($NH_3$) will effectively scavenge fluorine from the silicon tetrafluoride. As a result of such fluorine scavenging, the $SiF_4/NH_3$ mixture will at least partially inhibit the halogen cycle within the ion source that results in poor source life due to tungsten whiskers growing on the arc slit and/or tungsten depositing on the cathode and/or anticathode.

Such usage of ammonia as a co-flow gas with $SiF_4$ can be effected in any of a variety of arrangements. In one embodiment, separate gas supply vessels for ammonia and silicon tetrafluoride are employed, and the gases from the respective gas supply vessels are co-flowed to the ion source. The co-flowed gases may be mixed prior to passage through a mass flow controller, or mixed between a mass flow controller and the ion source, or mixed within the ion source.

Alternatively, a single supply vessel containing a mixture of ammonia and silicon tetrafluoride, in any suitable relative proportions, can be provided.

In lieu of, or in addition to, ammonia, any suitable amines could likewise be used to advantage.

As a further alternative, xenon can be provided as a supplemental gas in a separate supply vessel. After being dispensed from the supply vessel, the xenon can be mixed with ammonia and/or silicon tetrafluoride. Xenon can also be provided as a supplemental gas in a gas vessel containing xenon mixed with ammonia and/or silicon tetrafluoride. The presence of xenon in the gas introduced to the ion source improves source life by the sputtering effect of the xenon on the cathode, to remove any excess tungsten that deposits on such cathode.

The disclosure in yet another aspect relates to an improved ion implantation process that comprises, consists essentially of, or consists of flowing one or more isotopically enriched silicon dopant materials, such as for example silane or silicon tetrafluoride, into an ionizing chamber to generate ionic dopant species, extracting the ionic dopant species from the ionizing chamber, selecting a predetermined ionic dopant species and implanting the selected/desired silicon ionic dopant species into a photovoltaic, flat-panel, microelectronic or semiconductor substrate.

The enrichment of a desired silicon isotope in accordance with the present disclosure will increase the abundance or concentration of such isotope and correspondingly increase the quantity of the isotope in the ion beam. This in turn yields a corresponding advantage in throughput as compared with systems and/or processes that utilize a silicon source containing a lower concentration/amount of the same/desired silicon isotope.

The disclosure contemplates sequential flow of dopant materials, in which cathode bias power is monitored during operation of the ion source and the monitored cathode bias source power is utilized in a feedback control process for controlling/selecting/alternating between respective ones of the dopant compounds delivered to the ion source, in order to extend the operating lifetime of the ion source or its components, e.g., by maintaining a predetermined cathode bias power in the operation of the ion source. Such method can be utilized to repair or remediate the cathode of the ion source, i.e., to effect regrowth or etching of the cathode, as required to maintain or otherwise achieve a predetermined cathode bias power in the operation of the ion source.

The ion source may be of any suitable type in such monitored and controlled process, e.g., an indirect hot cathode (IHC) ion source. Cathode bias power in such method is advantageously used as a feedback mechanism to control sequential flow of different dopant compounds to extend the operating lifetime of the ion source/cathode.

This method of operating an ion implantation system including a cathode in an arc chamber of an ion source, to maintain operating efficiency of the ion source, in one embodiment includes contacting the cathode with sequentially supplied dopant compositions, while measuring cathode bias power, and in response to the measured cathode bias power, modulating at least one of said sequentially supplied dopant compositions, to extend operating lifetime of the ion source, cathode and/or one or more other components of the ion source.

The term "modulating" in reference to the sequentially supplied dopant compositions, means that the sequence, duration, process conditions, or dopant composition selection for at least one of the sequentially supplied dopant compositions is controlled, i.e., selectively varied, in response to the measured cathode bias power. Thus, the supply periods for each of the dopant compositions may be varied in relation to one another, to maintain a set point cathode bias power value, or one dopant composition may be supplied at higher voltage conditions than another, or the feedback monitoring and control system may be arranged to otherwise control/select/alternate between the respective dopant compositions.

In another embodiment, the method may be utilized to flow concurrently or sequentially a cleaning agent or a deposition agent through the ion source, in relation to one or more dopant compositions, wherein the cathode bias power or other power utilization variable of the ion source is utilized to effect etching of the cathode to remove deposits therefrom, e.g., if the monitored power usage increases above an initial or other predetermined or setpoint value or level, by flowing an etch cleaning agent through the ion source, and/or wherein the cathode bias power or other power utilization variable of the ion source is utilized to effect regrowth of cathode material by flow of a deposition agent therefor through the ion source, if the monitored power usage decreases below an initial or other predetermined or setpoint value.

The disclosure therefore contemplates various aspects, features, and advantages associated with the utilization of isotopically enriched silicon dopant compositions.

It will therefore be appreciated that the compositions, processes, methods, apparatus and systems of the disclosure are susceptible to implementation and application in a wide variety of manners, to provide corresponding improvements in performance of an ion implantation system.

While the disclosure has been set out herein in reference to specific aspects, features and illustrative embodiments, it will be appreciated that the utility of the disclosure is not thus limited, but rather extends to and encompasses numerous other variations, modifications and alternative embodiments, as will suggest themselves to those of ordinary skill in the field of the present disclosure, based on the description herein. Correspondingly, the invention as hereinafter claimed is intended to be broadly construed and interpreted, as including all such variations, modifications and alternative embodiments, within its spirit and scope.

What is claimed is:

1. A dopant gas composition supply for ion implantation of silicon, said supply being selected from the group consisting of:
   (A) a gas storage and dispensing vessel containing a silicon dopant composition comprising silicon dopant gas in mixture with supplemental gas comprising at least one of a diluent gas and a co-species gas, wherein the silicon dopant composition comprises at least one gaseous silicon compound that is isotopically enriched above natural abundance in at least one of $^{28}Si$, $^{29}Si$, and $^{30}Si$; and
   (B) a gas supply kit comprising (i) a first gas storage and dispensing vessel containing silicon dopant gas, and (ii) a second gas storage and dispensing vessel holding supplemental gas comprising at least one of a diluent gas and a co-species gas, wherein at least one of the silicon dopant gas and, when present, a co-species gas, is isotopically enriched above natural abundance in at least one of $^{28}Si$, $^{29}Si$, and $^{30}Si$.

2. The dopant gas composition supply according to claim 1, comprising a silicon compound selected from the group consisting of silicon tetrafluoride ($SiF_4$), silane ($SiH_4$), disilane ($Si_2H_6$), $C_1$-$C_8$ alkylsilanes, fluorosilanes, and chlorosilanes.

3. The dopant gas composition supply according to claim 2, wherein said silicon compound is isotopically enriched above natural abundance in $^{28}Si$.

4. The dopant gas composition supply according to claim 3, wherein said silicon compound comprises silicon tetrafluoride, isotopically enriched in $^{28}Si$ in a range of concentration that is greater than 92.3 atomic % and up to 100 atomic %.

5. The dopant gas composition supply according to claim 4, wherein said silicon tetrafluoride is homoisotopic in $^{28}Si$.

6. The dopant gas composition supply according to claim 1, wherein said supplemental gas comprises a diluent gas selected from the group consisting of argon, hydrogen, fluorine, krypton, neon, helium, ammonia, amines, water, phosphine, arsine, germane, hydrogen selenide, hydrogen sulfide, nitrogen, oxygen, carbon monoxide, xenon difluoride, diborane, methane, and xenon.

7. The dopant gas composition supply according to claim 1, wherein the dopant gas composition comprises a gas composition selected from the group consisting of:
   (i) isotopically enriched silicon tetrafluoride with xenon and hydrogen;
   (ii) isotopically enriched silicon tetrafluoride with silane;
   (iii) isotopically enriched silicon tetrafluoride and isotopically enriched silane;
   (iv) isotopically enriched silicon tetrafluoride with argon;

(v) isotopically enriched silicon tetrafluoride with disilane;
(vi) isotopically enriched silicon tetrafluoride and isotopically enriched disilane;
(vii) isotopically enriched silicon tetrafluoride with hydrogen;
(viii) isotopically enriched silicon tetrafluoride with ammonia;
(ix) isotopically enriched silicon tetrafluoride with ammonia and xenon;
(x) isotopically enriched silicon tetrafluoride with hydrogen and krypton;
(xi) isotopically enriched silicon tetrafluoride with ammonia and krypton;
(xii) isotopically enriched silicon tetrafluoride with nitrogen;
(xiii) isotopically enriched silicon tetrafluoride with nitrogen and xenon;
(xiv) isotopically enriched silicon tetrafluoride with nitrogen and krypton; and
(xv) isotopically enriched silicon tetrafluoride with one or more of the following: hydrogen, nitrogen, ammonia, xenon, and argon.

8. The dopant gas composition supply according to claim 1(A).

9. The dopant gas composition supply according to claim 1(B).

10. An ion implantation system, comprising an ion implanter arranged in gas-receiving flow communication with a dopant gas composition supply according to claim 1.

11. The ion implantation system of claim 10, wherein the ion implanter is adapted to:
(A) ionize the silicon dopant composition from said dopant gas composition supply and form ionized silicon, and to contact the ionized silicon with a substrate to implant silicon therein; and
(B) (i) generate an ion beam of said ionized silicon, and accelerate the ion beam by electric field to the substrate for implantation of silicon therein, or (ii) conduct a plasma immersion process for implantation of silicon in the substrate.

12. A method for enhancing operation of an ion implantation system, comprising providing for use in the ion implantation system a dopant gas composition supply according to claim 1.

13. The method of claim 12, wherein the dopant gas composition supply comprises a silicon compound selected from the group consisting of silicon tetrafluoride ($SiF_4$), silane ($SiH_4$), disilane ($Si_2H_6$), $C_1$-$C_8$ alkylsilanes, fluorosilanes, and chlorosilanes.

14. The method of claim 13, wherein said silicon compound comprises silicon tetrafluoride ($SiF_4$), isotopically enriched above natural abundance in $^{28}Si$, in a range of concentration that is greater than 92.3 atomic % and up to 100 atomic %.

15. The method of claim 14, wherein said silicon tetrafluoride is homoisotopic in $^{28}Si$.

16. The method of claim 12, wherein said supplemental gas comprises a diluent gas selected from the group consisting of argon, hydrogen, fluorine, krypton, neon, helium, ammonia, amines, water, phosphine, arsine, germane, hydrogen selenide, hydrogen sulfide, nitrogen, oxygen, carbon monoxide, xenon difluoride, diborane, methane, and xenon.

17. The method of claim 12, wherein the dopant gas composition comprises a gas composition selected from the group consisting of:
(i) isotopically enriched silicon tetrafluoride with xenon and hydrogen;
(ii) isotopically enriched silicon tetrafluoride with silane;
(iii) isotopically enriched silicon tetrafluoride and isotopically enriched silane;
(iv) isotopically enriched silicon tetrafluoride with argon;
(v) isotopically enriched silicon tetrafluoride with disilane;
(vi) isotopically enriched silicon tetrafluoride and isotopically enriched disilane;
(vii) isotopically enriched silicon tetrafluoride with hydrogen;
(viii) isotopically enriched silicon tetrafluoride with ammonia;
(ix) isotopically enriched silicon tetrafluoride with ammonia and xenon;
(x) isotopically enriched silicon tetrafluoride with hydrogen and krypton;
(xi) isotopically enriched silicon tetrafluoride with ammonia and krypton;
(xii) isotopically enriched silicon tetrafluoride with nitrogen;
(xiii) isotopically enriched silicon tetrafluoride with nitrogen and xenon;
(xiv) isotopically enriched silicon tetrafluoride with nitrogen and krypton; and
(xv) isotopically enriched silicon tetrafluoride with one or more of the following: hydrogen, nitrogen, ammonia, xenon, and argon.

* * * * *